United States Patent [19]

Nahm

[11] Patent Number: 4,861,629

[45] Date of Patent: Aug. 29, 1989

[54] POLYFUNCTIONAL ETHYLENICALLY UNSATURATED CELLULOSIC POLYMER-BASED PHOTOCURABLE COMPOSITIONS

[75] Inventor: Steven H. Nahm, Wilmington, Del.

[73] Assignee: Hercules Incorporated, Wilmington, Del.

[21] Appl. No.: 137,832

[22] Filed: Dec. 23, 1987

[51] Int. Cl.[4] .......................... B05D 3/02; B05D 3/12; B32B 27/00; B32B 27/40

[52] U.S. Cl. ..................................... 427/355; 427/393; 428/425.1; 428/541; 522/89; 526/238.21; 527/301

[58] Field of Search .................. 427/393, 355; 522/89; 526/238.21; 527/301; 428/425.1, 541

[56] References Cited

U.S. PATENT DOCUMENTS

| | | | |
|---|---|---|---|
| 3,328,324 | 6/1967 | Breslow et al. | 260/22 |
| 3,509,234 | 4/1970 | Burlant et al. | 260/899 |
| 3,749,592 | 7/1973 | Gaske et al. | 204/159.12 X |
| 3,782,950 | 1/1974 | Ranz et al. | 96/85 |
| 4,056,453 | 11/1977 | Barzynski et al. | 204/159.23 |
| 4,066,582 | 1/1978 | Babian et al. | 260/17 |
| 4,112,182 | 9/1978 | Newland et al. | 428/336 |
| 4,134,809 | 1/1979 | Pacifici et al. | 204/159 |
| 4,164,459 | 8/1979 | Noomen et al. | 204/159.18 |
| 4,565,857 | 1/1986 | Grant et al. | 527/301 |
| 4,654,233 | 3/1987 | Grant et al. | 427/379 |
| 4,656,202 | 4/1987 | Nason et al. | 522/89 |
| 4,670,068 | 6/1987 | Chi | 149/19.4 |

FOREIGN PATENT DOCUMENTS

| | | |
|---|---|---|
| 1147732 | 3/1967 | United Kingdom . |
| 1505898 | 7/1975 | United Kingdom . |
| 2159524A | 12/1985 | United Kingdom . |

*Primary Examiner*—Michael Lusignan
*Attorney, Agent, or Firm*—Marion C. Staves

[57] ABSTRACT

A novel and improved photocurable coating composition is provided which comprises a polyfunctional ethylenically unsaturated cellulosic polymer which is derived from the reaction product of (a) at least one cellulosic polymer having isocyanate reactive hydroxyl functionality, and (b) at least one hydroxyl reactive poly (alpha, beta ethylenically unsaturated) isocyanate.

10 Claims, No Drawings

4,861,629

POLYFUNCTIONAL ETHYLENICALLY UNSATURATED CELLULOSIC POLYMER-BASED PHOTOCURABLE COMPOSITIONS

FIELD OF THE INVENTION

This invention relates to photocurable coating compositions comprising polyfunctional ethylenically unsaturated cellulosic polymers.

BACKGROUND OF THE INVENTION

It is known that cellulosic esters containing alpha, beta unsaturation are useful as resins and modifying resins in formulating photocurable compositions for use, such as, protective coatings for wood and other solid substrates. For example, U.S. Pat. Nos. 4,565,857; 4,654,233; 4,656,202 and 3,749,592 describe photocurable coating compositions comprising polymerizable monofunctional ethylenically unsaturated cellulosic esters derived from the reaction of a hydroxyl functional cellulosic ester and a monoethylenically unsaturated compound having a hydroxyl reactive group, for instance, 2-isocyanatoethyl acrylate or methacrylate, or a monourethane.

Such photocurable compositions have certain drawbacks, however, in that toxic or irritating reactive diluents or plasticizers are needed to crosslink with the ethylenically unsaturated cellulosic esters to maximize solvent resistance and strength of the cured coating, which in turn, provide for additional handling and manufacturing problems. The present invention avoids such drawbacks by providing a novel photocurable coating composition with greatly improved crosslinking efficiency, and which significantly reduces or eliminates the need for reactive diluents or plasticizers and the like to provide maximum solvent resistance and strength in cured products manufactured therefrom. Accordingly, the present invention provides a photocurable coating composition comprising a polyfunctional cellulosic polymer having an average of at least 1.5 terminal alpha,-beta-ethylenic unsaturations per substituted position of anhydroglucose unit of the polymer which is derived from the reaction product of (a) at least one cellulosic polymer having isocyanate reactive hydroxyl functionality, and (b) at least one hydroxyl reactive poly(alpha,-beta-ethylenically unsaturated) isocyanate produced from the reaction of (i) a hydroxyl functional (meth)acrylic ester with
(ii) a polyisocyanate having an average of at least three hydroxyl reactive isocyanate groups.

The following detailed description is more fully illustrative of the present invention.

DETAILED DESCRIPTION OF THE INVENTION

Cellulosic polymers which are useful in this invention include ester and ether derivatives of cellulose which have isocyanate reactive hydroxyl functionality. Examples of such ester derivatives include nitrocellulose and cellulosic esters of saturated aliphatic monocarboxylic acids having from 1 to 6 carbon atoms or aromatic monocarboxylic acids, preferably cellulose acetate, cellulose acetate propionate, cellulose acetate butyrate or cellulose acetate benzoate. Other useful carboxylated cellulose esters having isocyanate reactive hydroxyl functionality include cellulose acetate succinate, cellulose acetate tetrahydrophthalate, cellulose propionate phthalate, cellulose butyrate phthalate, cellulose butyrate 3-nitrophthalate, cellulose butyrate phthaloyl dicarboxylic acid, cellulose butyrate succinate, and the like. Such cellulose esters are well known in the art and are described, for example, in U.S. Patent No. 4,134,809.

Examples of cellulosic ether derivatives suitable for use in this invention include hydroxyethyl cellulose, hydroxypropyl cellulose, hydroxyethylhydroxypropyl cellulose and the like. Such ether derivatives are also well known.

Generally, the molecular weight of those cellulosic polymers which are useful in this invention is not critical, however, polymers having molecular weights ranging from about 2,000 to about 200,000, and an average degree of substitution of about 0.3 to about 1.8 isocyanate reactive hydroxyl groups per anhydroglucose unit of cellulosic polymer are preferred, with an average of about 0.5 to about 1.3 being most preferred.

An anhydroglucose unit of cellulosic polymer is well known in the art and can be characterized for purposes of this invention by the following structural formula:

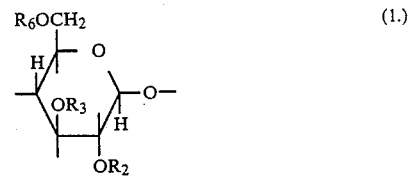

(1.)

where R represents a substituted moiety with the subscripts 2,3 and 6 denoting the substituted position on the anhydroglucose unit.

Hydroxyl reactive poly(alpha,beta-ethylenically unsaturated) isocyanates which are reacted with the cellulosic polymers described above, in accordance with this invention, can be represented by the following general structural formula:

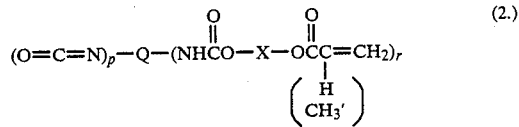

(2.)

where Q is a multivalent organic radical and x is a saturated or unsaturated, linear, branched or cyclic divalent organic radical having from 2 to 20 carbon atoms, and where p is an average of at least 1 and r is an average of at least 1.5. Such unsaturated isocyanates can be conveniently prepared from the reaction of a hydroxyl functional (meth)acrylic ester and a polyisocyanate. Acrylic or methacrylic esters useful herein include any of the various hydroxymono-, di-, and tri(meth)acrylic esters containing terminal alpha, beta-ethylenic unsaturation, and their corresponding glycol or ester-extended analogues. Examples of such (meth)acrylic esters include 2-hydroxyethyl (meth)acrylate, 2-hydroxyproply(meth)acrylate, 4-hydroxybutyl (meth)acrylate 12-hydroxydodecanyl(meth)acrylate, 2-hydroxy-3-chloropropyl(meth)acrylate, trimethylol propane di(meth)acrylate, pentaerythritol diacrylate, pentaerythritol triacrylate, and the like. Other examples include caprolactone extended hydroxyethyl acrylate available as Tone M-100 from Union Carbide Corporation; polypropylene glycol monomethacrylate (PPGMM), available from Alcolac, Inc.; and Photomers 4152 hydroxydiacrylate and 4171 hydroxytriacrylate (PH 4152 and PH 4172, respectively) both available from Henkel KGaA. Similarly, related (meth)acrylamide derivatives are also useful herein, for example, N-hydroxymethylacrylamide and N-hydroxymethylmethacrylamide, as are glycidyl(meth)acrylic esters, such as described in U.S. Pat. No. 4,134,809.

Any polyisocyanate having an average of at least three hydroxyl reactive isocyanate groups is useful for preparing the poly(alpha,beta-ethylenically unsaturated) isocyanates in accordance with this invention. Examples of such polyisocyanates include diisocyanate oligomers containing biuret, isocyanurate, ureathane or similar linkages between diisocyanate monomer units. It is preferred, however, that such polyisocyanates are derivatives of acyclic, saturated or unsaturated, linear or branched, polyvalent organic radicals having at least three atoms selected from carbon, oxygen, phosphorous, nitrogen and sulfur. Specific examples include isocyanate oligomers of hexamethylene diisocyanate 2,2,4-trimethyl-hexane-1,6-diisocyanate, 2,4,4-trimethylhexane-1,6-diisocyanate, cyclohexyl-1,4-diisocyanate, diphenylene methane diisocyanate, isophorone diisocyanate, toluene diisocyanate, and any of those commercially available from Mobay Chemical Corporation under the trade name Mondur and Desmondur (oligomers of hexamethylene diisocyanate) which contain an average of at least 3 hydroxyl reactive isocyanate groups, preferably Desmodur N 3200 (containing an average of 3.2 isocyanate groups per molecule) and Desmondur N 100 (containing an average of 3.8 isocyanate groups per molecule).

Also useful in this invention are the various polyisocyanates obtained from the reaction of typically low molecular weight diisocyanates (e.g., toluene diisocyanate) or mixtures of two or more of such compounds with water or other known oligomerization catalysts, and/or low molecular weight polyols, e.g., gylcerine, and/or polyamines, e.g., ethylene diamine. Examples of such polyisocyanates include the adduct of trimethylol propane and toluene diisocyanate, the adduct of hexamethylene diisocyanate, isophorone diisocyanate and trimethylol propane, and the adduct of pentaerythritol and hexamethylene diisocyanate, such as disclosed in U.S. Pat. No. 4,164,459.

In a preferred embodiment of this invention, the conditions and stoichiometry of the reaction between the hydroxyl functional (meth)acrylic ester (or related compound) and the polyisocyanate is controlled such that a substantial portion, preferably an average of at least 5 mole percent and most preferably an average of 10 mole percent or more, of the resulting product is at least a monoisocyanate compound containing an average of at least 1.5 terminal alpha,beta-ethylenic unsaturations per molecule. Accordingly, the molar ratio of hydroxyl functional (meth)acrylic ester (or related compound) to polyisocyanate can range from about 0.6 to about 0.9, preferably from about 0.7 to about 0.9, depending, of course, on such factors as the specific reactants employed, i.e., the average number of isocyanate groups per molecule of polyisocyanate employed, and the degree of hydroxyl reactive isocyanate group substitution desired in the resulting product. Generally, the ratio will increase as the average number of hydroxyl reactive isocyanate groups per molecule of polyisocyanate increases, therein requiring less equivalents of polyisocyanate to react with the hydroxyl functionality of the (meth)acrylic esters or related compounds.

In general, this reaction is preferably conducted by mixing the hydroxyl functional (meth)acrylic ester with the polyisocyanate in a suitable dry, non-reactive solvent, for example, tetrahydrofuran, toluene, acetone, methylethylketone, ethylacetate, butylacetate and the like. Suitable urethane catalysts which are well known to those skilled in the art are also preferably employed. Such catalysts are described, for example, in U.S. Pat. No. 4,656,202. Preferred are metallic-based catalysts such as dibutyltindilaurate, dibutyltindiacetate, stannous acetate, stannous octoate, stannous tallate, dibutyltinoxide and the like. Preferably, such catalysts are employed in amounts from about 0.002 to about 1.0 weight percent, based on the total weight percent of reactants.

It is also preferred to employ a radical polymerization inhibitor in the reaction mixture to insure that the ethylenically unsaturated reactants do not polymerize prematurely. Such compounds are useful in amounts ranging from about 0.001 to about 0.1 weight percent based on the amount of ethylenically unsaturated reactant present. Examples of these inhibitors include hydroquinone, hydroquinone monomethyl ether, catecholo, 2,6-diterbutyl-4-methyl-phenol, phenothiazine and the like. Such inhibitors are also described in U.S. Pat. No. 4,656,202. Reaction temperatures can vary from about 0° C. to about 100° C.

The following examples more fully illustrate the preparation of hydroxyl reactive poly(alpha,beta-ethylenically unsaturated) isocyanates useful in this invention. It is to be understood, however, that this invention is not to be limited in any way thereto.

EXAMPLES 1-8

These examples illustrate the preparation of preferred poly(alpha,beta-ethylenically unsaturated) isocyanates which are reacted with the aforementioned cellulosic polymers to form the polyfunctional cellulosic polymers useful in the photocurable coating compositions of this invention.

EXAMPLE 1

In this example, 30.03 grams of Desmodur N 100 (an oligomer of hexamethylene diisocyanate containing an average of 3.8 isocyanate groups per molecule) is dissolved in 50 milliliters of a dry solvent, such as those described above, which also contains 27 milligrams of a 1:1 mixture of 2,6-diterbutyl-4-methyl phenol and hydroquinone monomethyl ether. To this mixture is added 14.97 grams of hydroxyethylmethacrylate (HEMA) and 0.10 grams (0.22 weight percent) of dibutyltindilaurate catalyst. The reaction mixture is then allowed to stir at 25° C. for approximately 16 hours.

EXAMPLES 2-4

In these Examples, the same procedure as set out in Example 1 is followed, except that molar ratio of HEMA to polyisocyanate is altered according to that as summarized in Table I below.

EXAMPLES 5-8

The same procedure as set out in Examples 1-4 was followed except that Desmodur N 3200 (an oligomer of hexamethylene diisocyanate containing an average of 3.2 isocyanate groups per molecule) is substituted for Desmodur N 100.

Product distribution described in terms of average mole percent of product containing at least one or more isocyanate groups per molecule available for further reaction with isocyanate reactive hydroxyl groups present in the cellulosic polymers described above, and also containing an average of at least 1.5 terminal alpha,beta-ethylenic unsaturations per molecule is then calculated for each example using well known methods of statistical analysis described, for example, in "Monte Carlo Methods", by J. M. Hammersley and D. C. Handscomb, Methuem, London (1964). The results are summarized in Table 1 below.

TABLE 1

| Example No. | *HEMA/ polyisocyanate | % Average non-reacted isocyanate groups | Average mole % isocyanate groups remaining in molecule | | | Average ethylenic unsaturations per molecule having one or more isocyanate groups |
|---|---|---|---|---|---|---|
| | | | 0 (groups) | 1 | 2 | |
| 1 | 35/60 | 42 | 16 | 21 | 63 | 2.1 |
| 2 | 40/60 | 32 | 23 | 23 | 54 | 2.1 |
| 3 | 45/60 | 25 | 31 | 23 | 46 | 2.1 |
| 4 | 50/60 | 17 | 41 | 23 | 36 | 2.2 |
| 5 | 35/60 | 42 | 30 | 25 | 45 | 1.6 |
| 6 | 40/60 | 32 | 40 | 24 | 36 | 1.9 |
| 7 | 45/60 | 25 | 51 | 23 | 26 | 1.7 |
| 8 | 50/60 | 17 | 65 | 18 | 17 | 1.7 |

*Describes molar ratio of equivalent isocyanate reactive hydroxyl groups to reactive isocyanate groups.

In accordance with this invention, at least one hydroxyl reactive poly(alpha,beta-ethylenically unsaturated) isocyanate, as described above, is then reacted with a cellulosic polymer having isocyanate reactive hydroxyl functionality, again as described above, to produce a polyfunctional cellulosic polymer having an average of at least 1.5 terminal alpha,beta-ethylenic unsaturations per substituted position of anhydroglucose unit of the polymer, and which are useful in the photocurable coating compositions of this invention.

As previously mentioned herein an anhydroglucose unit of cellulosic polymer can be characterized for purposes of this invention by the following general formula:

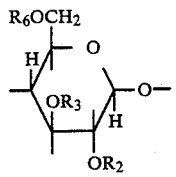

(3.)

where R represents a substituted moiety with the subscripts 2, 3 and 6 denoting the substituted position on the anhydroglucose unit.

This reaction is preferably conducted by simply mixing the poly(unsaturated)isocyanate, the cellulosic polymer, a catalyst for the isocyanate/hydroxyl reaction, and a radical polymerization inhibitor in a suitable dry solvent. The same solvents, catalysts and other reagents and their respective amounts described above for use in the preparation of the poly(alpha,beta-ethylenically unsaturated) isocyanates of this invention are also useful in this reaction. In a preferred embodiment the instant reaction may be carried out in a "two-step, one-pot" method, wherein a poly(alpha,beta-ethylenically unsaturated) isocyanate is prepared according to the procedure set forth in Example 1, followed by the addition thereto of a solution or suspension of the cellulosic polymer. In any event, the reaction mixture is allowed to react at temperatures ranging from about 0° C. to 100° C. for a period of time as demonstrated by the disappearance of infrared detectable isocyanate groups. Preferably about 5 to 30 percent of the available isocyanate reactive hydroxyl groups present on the cellulosic polymer are reacted with the poly(unsaturated) isocyanate. In a preferred embodiment of this invention, any unreacted isocyanate remaining at this point can be consumed by the addition of a low molecular weight primary alcohol, preferably ethanol. The resulting polyfunctional ethylenically unsaturated cellulosic polymer can then be isolated, if desired, by precipitation into a suitable non-solvent to remove any non-reacted ethylenically unsaturated material.

Preferably, the molar ratio of isocyanate reactive hydroxyl groups on the cellulosic polymer to hydroxyl reactive poly(unsaturated) isocyanate will range from about 20:1 to about 1:1, most preferably, from about 10:1 to about 1:1, depending upon such factors as the average degree of substitution of isocyanates reactive hydroxyl functionality present in the cellulosic polymer and the polymer's reactivity towards hydroxyl reactive isocyanates. In a preferred procedure in accordance with this invention, the reaction is accomplished in the presence of a molar excess of isocyanate reactive hydroxyl functionality on the cellulosic polymer.

The following examples are provided to better illustrate the preparation of polyfunctional ethyleniclly unsaturated cellulosic polymers in accordance with the present invention.

EXAMPLES 9–20

In these examples, solutions of poly(alpha,beta-ethylenically unsaturated) isocyanates are prepared according to the procedure set forth in Examples 1–8 based on the tabulated stoichiometries summarized in Table 2 below. Where indicated in Table 2, HEMA has been substituted for other hydroxyl functional (meth)acrylic esters, for example, hydroxybutyl acrylate (HBA), caprolactone extended hydroxyethyl acrylate (Tone M-100), polypropylene glycol monomethacrylate (PPGMM), Photomer 4152 hydroxyldiacrylate (PH 4152), and Photomer 4171 hydroxytriacrylate (PH 4171). Polyfunctional ethylenical unsaturated cellulosic polymers are then conveniently prepared via a "two-step, one-pot" method by adding solutions of various cellulosic polymers in a common solvent and in their respective indicated amounts, as summarized in Table 2, to the previously prepared solutions of poly(unsaturated) isocyanates. The reaction mixtures are then stirred for approximately 16–24 hours at ambient temperature. Any unreacted isocyanate then remaining, as detected by infrared spectroscopy, is consumed by the addition of ethyl alcohol.

TABLE 2

| Example No. | Hydroxy Functional (meth)acrylic ester | | | Polyisocyanate | | | Cellulosic polymer | | |
|---|---|---|---|---|---|---|---|---|---|
| | type | weight (grams) | hydroxyl milliquivalents | type | weight (grams) | isocyanate milliquivalents | *type | weight (grams) | hydroxyl milliquivalents |
| 9  | HEMA  | 6.5  | 50.0  | N-3200 | 11.0 | 60.1  | RS ¼ | 26.0  | 100 |
| 10 | HEMA  | 26.0 | 200.0 | N-3200 | 45.8 | 250.3 | RS ¼ | 104.0 | 400 |
| 11 | HEMA  | 6.5  | 50.0  | N-3200 | 11.0 | 60.1  | CAP  | 33.3  | 100 |
| 12 | HEMA  | 6.5  | 50.0  | N-3200 | 11.0 | 60.1  | CAB  | 39.5  | 100 |
| 13 | HEMA  | 13.0 | 100.0 | N-100  | 27.0 | 141.4 | CAP  | 38.9  | 117 |
| 14 | HEMA  | 15.0 | 115.4 | N-100  | 30.0 | 157.1 | SS ¼ | 55.0  | 220 |
| 15 | HBA   | 6.5  | 45.1  | N-3200 | 11.0 | 60.1  | RS ¼ | 39.0  | 150 |
| 16 | TONE  | 17.2 | 50.0  | N-3200 | 11.4 | 62.6  | RS ¼ | 26.0  | 100 |
| 17 | TONE  | 15.5 | 45.0  | N-3200 | 11.0 | 60.1  | RS ¼ | 39.0  | 100 |
| 18 | PPGMM | 18.0 | 45.0  | N-3200 | 11.0 | 60.1  | RS ¼ | 39.0  | 100 |
| 19 | PH 4152 | 28.8 | 45.0 | N-3200 | 11.0 | 60.1  | RS ¼ | 39.0  | 100 |
| 20 | PH 4171 | 24.0 | 45.0 | N-3200 | 11.0 | 60.1  | RS ¼ | 39.0  | 100 |

*RS ¼ and SS ¼ are different grades of nitrocellulose (NC) available from Hercules Incorporated. CAP and CAB denote cellulose acetate propionate and cellulose acetate butyrate, respectively.

Photocurable coating compositions having greatly improved crosslinking efficiency, therein significantly reducing or eliminating the need for added cocurable reactive diluents, plasticizers and the like, can be conveniently prepared using the polyfunctional ethylenically unsaturated cellulosic polymers of this invention. Coating compositions prepared as such display comparable or improved solvent and abrasion resistance relative to those coating compositions which are currently available.

Preparation of the coating compositions can be conducted by simply mixing in the desired proportions the polyfunctional ethylenically unsaturated cellulosic polymer described above with a suitable ultraviolet photoinitiator in a suitable solvent or solvent mixture. Preferably, the solvent employed in the preparation of the poly(alpha, beta-ethylenically unsaturated) isocyanates and their subsequent reaction with the cellulosic polymer in accordance with this invention is employed herein.

Compounds useful as photoinitiators in the practice of this invention are well known in the art and include, for example, benzophenone, 1-chloronaphthalene, 2-chloronaphthalene, 2-chlorothioxanthone, 2,2-diethoxyacetophenone, 2,3-dichloronaphthoquinone, 4,4'-bis(2-chloroacetyl) benzene, 2,2,2-trichloroacetophenone, benzoin isopropyl ether, 4'-tertbutyl-2,2,2-trichloroacetophenone, 4,4'-bis(chloromethyl) benzophenone, 4-chloromethyl-4'-carbomethoxy benzophenone, 2-chloromethylbenzimidazole, 4,4'-dimethylbenzophenone, 3,4-bit(chloromethyl) benzophenone, benzophenone/methyl diethanolamine, 2,2-dimethoxy-2-phenyl-acetophenone, and benzoin isobutyl ether. Other photoinitiators useful herein include those described, for example, in U.S. Pat. No. 4,134,809; the use of any particular photoinitiator is not critical to the practice of this invention.

These photoinitiators can be added at any point in the production of the coating compositions in amounts ranging from about 0.1 to about 10 weight percent, preferably from about 1 to about 5 weight percent, based on the total weight of the coating composition. The amount will depend, of course, on the particular photoinitiator employed.

Alternatively, the photocurable coating compositions can be prepared in the absence of photoinitiators when curing is to be carried out by electron beam radiation.

In yet another embodiment of this invention, the coating compositions can be cured without active radiation upon the addition thereto of metal oxidation catalysts such as those based on Ca, Zn, Pb, Fe and the like. Such catalysts are well known in the art.

Generally, the amount of polyfunctional, ethylenically unsaturated cellulosic polymer component of the photocurable coating composition can range from about 10 to about 100 weight percent, preferably from about 50 to about 80 weight percent based on the total curable solids present in the coating composition.

Of course, other additives which may be compounded with the photocurable coating compositions of the instant invention include, for example, binders, fillers, e.g. silica and metal oxides, pigments, dyes, flow control or thixotropic agents, reinforcing agents, plasticizers stabilizers, inhibitors, lubricants, and the like. The addition of such materials, which are preferably transparent to radiation, will depend on the specific end uses contemplated for the coating compositions.

Additionally, other polymerizable or copolymerizable compounds which can react with the polyfunctional ethylenically unsaturated cellulosic polymer component can be optionally incorporated into the coating compositions, again depending on the particular end used contemplated, to modify the properties thereof, e.g. hardness, flexibility, adhesion, and the like. Such compounds include, for example, ethylenically unsaturated monomers such as methyl methacrylate, ethyl acrylate, chlorohexyl acrylate, styrene, divinylbenzene, 2-chlorostyrene, acrylic acid, acrylamide, acrylonitrile, tert-butyl acrylate, methyl acrylate and the like. Such polymerizable or copolymerizable compounds useful in this invention will be readily apparent to those skilled in the art. Typically, such compounds are useful in the instant coating compositions up to about 75, preferably less than about 50 weight percent, based on the total polymerizable solids weight of the composition. However, the amount employed can extend well outside these ranges, depending upon the particular property of the composition to be modified and the contemplated end use of the resulting coating composition.

Furthermore, non-reactive film forming resins can be included in the coating compositions of the instant invention, for example, nitrocellulose and other non-ethylenically unsaturated derivatives of cellulosic polymers and oligomers thereof such as are useful in the instant invention for forming the polyfunctional ethylenically unsaturated cellulosic polymers. The amount of such resins employed can vary within the range mentioned above, again depending on such factors as the particular property of the coating composition to be modified, and those end uses contemplated.

The photocurable coating compositions can be coated on various substrates by any procedure known in the art, including spraying, brushing, dipping and the like. Suitable substrates which can be coated include any of the conventional materials such as wood, plastics, metal and ceramics. However, such coatings are particularly suited for use as a top coating in furniture and wood or wood veneer coating applications where minor flaws or finish imperfections can be removed, for example, by buffing, rubbing or sanding after the coating composition is applied thereto and the solvent is allowed to evaporate, thus resulting in a workable intermediate dried stage of the composition. The intermediate stage, free of minor flaws and imperfections, can thereafter be fully cured by any of the several known methods in the art, for example by exposure to ultraviolet or electron beam radiation, to provide a hard, durable, rub and abrasion resistant finish. during this final cure, it is believed that ethylenically unsaturated components in the coating composition undergo a crosslinking reaction to form a tough, crosslinked polymeric matrix. Any of the several base and/or sealer coating compositions, all of which are well known in the art, can be employed in one or more coats on a given substrate prior to application of the coating composition of the present invention. Such base and/or sealer coating compositions are described, for example, in U.S. Pat. No. 4,656,202, and include alkyd resins, acrylic resins and cellulose acetate butyrate type resins. Alternatively, the coating compositions of the instant invention may be employed both as an initial base coat(s) and a final top coating. Should this method be employed, both the base coat and the top coat or finish coat can be cured as described herein subsequent to application and solvent evaporation.

The following examples are provided to further illustrate the photocurable coating compositions of the instant invention which have unexpectedly improved crosslinking efficiency therein providing for improved solvent and abrasion resistance compared to that displayed by coating compositions currently known in the art.

EXAMPLES 21–26

These examples illustrate the improved crosslinking efficiency of photocurable coating compositions prepared in accordance with this invention wherein the need for reactive diluents and the like to crosslink with the ethylenically unsaturated cellulosic polymers to provide maximum strength and rub resistance in the cured film is significantly reduced or eliminated.

Polyfunctional ethylenically unsaturated cellulosic polymers prepared in Examples 9–12 above are further precipitated to remove all non-reacted ethylenically unsaturated materials which can function as reactive diluents. The precipitated polymers are dried and then dissolved in 6:1 ethyl: butyl acetate to about 25 % weight total solids. A photoinitiator (dimethoxyphenyl acetophenone) is next added to each solution in an amount equal to 5 weight % solids, based on the total solids content, and the solids then adjusted to 20 weight %. To designated solutions of the unsaturated cellulosic polymer mixture summarized below in Table 3, hexanediol diacrylate is added as a reactive diluent in amounts equal to 10 weight % based on the total weight of the composition. Films from each composition are then cast on both clean degreased glass and Bonderite 100 steel plates to provide dry films with a nominal thickness of 1 mil. All dried films are then exposed under high intensity ultraviolet light (total energy equal to 3.8 J/CM$^2$) for 20 seconds, then aged for three days. Each cured film cast on glass plates is next extracted for a period of about 24 hours with acetone in a soxhlet extractor and the percent of material insoluble in acetone, representative of crosslinked solvent resistant material, is determined. In turn, each film cured on steel plates is tested for rub resistance to methyl ethyl ketone (MEK) by pushing an absorbant paper towel which has been saturated with the solvent back and forth across the surface of the film until the metal surface of the plate is exposed. The results are recorded in Table 3 below.

TABLE 3

| Example No. | Polymer (type) from Example No. | Coating Composition: polymer/reactive diluent | Acetone insoluble material (%) | *MEK rub resistance |
|---|---|---|---|---|
| 21 | 9 (NC) | 100/0 | 49 | 50 |
| 22 | 10 (NC) | 90/10 | 62 | 200+ |
| 23 | 11 (CAP) | 100/0 | 60 | 200+ |
| 24 | 11 (CAP) | 90/10 | 80 | 200+ |
| 25 | 12 (CAB) | 100/0 | 45 | 200+ |
| 26 | 12 (CAB) | 90/10 | 84 | 200+ |

*denotes the number of double rubs

EXAMPLES 27–32

The following examples illustrate that the improved photocurable coating compositions of the instant invention, which comprise novel modified cellulosic polymers with 1/10 the molar substitution by unsaturated polymerizable material as required by currently known coating compositions, exhibit solvent resistance which is equivalent or superior to such known compositions.

In Examples 27–29, coating compositions are prepared in accordance with the instant invention as described in Examples 21–26 above using polyfunctional ethylenically unsaturated cellulosic polymers prepared in Examples 10–12. Films of each composition are then cast on steel plates and cured for respective times of 30, 60 and 90 seconds, again as described in the examples above, then aged for three days. Each respective sample is then tested for rub resistance in the manner described above.

Comparative coating compositions in Examples 30–32 are prepared in accordance with procedures described in U.S. Pat. No. 4,565,857, which comprise ethylenically unsaturated cellulosic polymers prepared from the reactants and their respective stoichiometries summarized immediately below in Table 4.

TABLE 4

| Example No. | Isocyanatoethyl methacrylate weight (grams) | Isocyanatoethyl methacrylate isocyanate milliquivalents | Cellulosic polymer *polymer type | Cellulosic polymer weight (grams) | Cellulosic polymer hydroxyl milliquivalents |
| --- | --- | --- | --- | --- | --- |
| 30 | 31.00 | 200 | NC | 104.00 | 400 |
| 31 | 7.75 | 50 | CAP | 33.11 | 99 |
| 32 | 7.75 | 50 | CAB | 40.00 | 101 |

*nitrocellulose (NC) grade RS ½ from Hercules Incorporated

Respective sample films are cast from each composition, then cured and tested for rub resistance in the manner described above. Results for all of the above examples are recorded in Table 5 below.

TABLE 5

| Example No. | from Example No. | Polymer (type) | Cellulosic polymer molar substitution | MEK Rub Resistance (seconds) 30 | 60 | 90 |
| --- | --- | --- | --- | --- | --- | --- |
| 27 | 21 (NC) | | 0.05 | 120 | 180 | 200+ |
| 28 | 23 (CAP) | | 0.05 | 200+ | 200+ | 200+ |
| 29 | 25 (CAB) | | 0.05 | 30 | 100 | 195 |
| 30 | 30 (NC) | | 0.5 | 100 | 155 | 200+ |
| 31 | 31 (CAP) | | 0.5 | 45 | 170 | 185 |
| 32 | 32 (CAB) | | 0.5 | 90 | 115 | 195 |

EXAMPLES 33-40

These examples further illustrate the improved coating compositions of the instant invention wherein films prepared therefrom exhibit superior crosslinking efficiency in both the presence and absence of reactive diluents compared to such coating compositions known in the art.

In Examples 33-35, ethylenically unsaturated cellulosic polymers in accordance with this invention are prepared according to the procedure described in Examples 9-20, from reactants and their respective stoichiometries summarized below in Table 6.

Comparative unsaturated cellulosic polymers in Examples 36-37 are then prepared according to procedures set forth in U.S. Pat. Nos. 4,565,857 and 3,749,592, respectively, using the reactants and their respective amounts as further summarized below in Table 6. In comparative Example 36, where the isocyanate employed is isocyanatoethyl methacrylate (IEM), no hydroxyl functional (meth)acrylic ester is needed since IEM contains unsaturation. In comparative Example 37, the isocyanate is toluene diisocyanate (TDI).

Coating compositions are then prepared in the manner described in Examples 21-26 from each of the unsaturated cellulosic polymers in the examples above without removing non-reacted ethylenically unsaturated materials which can further function as reactive diluents during curing of films formed from the compositions. Films are next prepared from each example composition on glass plates and exposed for 10 seconds except Example 33a, which was exposed for 90 seconds. Half of each film is then extracted with acetone for a period of about 24 hours immediately after exposure, and in turn the other half extracted after aging for three days. The percent of acetone-insoluble material, indicative of crosslinked solvent resistant material, is determined for each extraction sample and the results recorded in Table 7 below.

In Examples 38-40, unsaturated cellulosic polymers are prepared, again as above, except that prior to formulating coating compositions therefrom in the same manner as above all non-reacted ethylenically unsaturated material which could act as reactive diluents is twice precipitated out. Films are then formed, and cured as above, and the percent acetone insoluble material determined after a three day aging period. The results are also recorded below in Table 7.

TABLE 6

| Example No. | Hydroxyl Functional (meth)acrylic ester type | weight (grams) | hydroxyl milliquivalents | Isocyanate *type | weight (grams) | isocyanate milliquivalents | Cellulosic polymer weight | hydroxyl |
| --- | --- | --- | --- | --- | --- | --- | --- | --- |
| 33 | HEMA | 84 | 646 | N-100 | 167 | 874 | RS ½ 250 | 962 |
| 34 | HEMA | 13.0 | 100 | N-100 | 27.0 | 141.4 | CAP 38.9 | 117 |
| 35 | HEMA | 15.0 | 115.4 | N-100 | 30.0 | 157.1 | SS ½ 55.0 | 220 |
| 36 | — | — | — | IEM | 29.6 | 191 | RS ½ 49.4 | 190 |
| 37 | HEMA | 7.2 | 55 | TDI | 8.8 | 100 | RS ½ 50.0 | 192 |

*RS ½ and SS ½ are grades of nitrocellulose (NC) available from Hercules Incorporated.

TABLE 7

| Example No. | Polymer from Example No. | Acetone Insoluble Material (%) non-aged film | aged film |
| --- | --- | --- | --- |
| 33 | 33 | 48 | 54 |
| 33a | 33 | — | 79 |
| 34 | 34 | 83 | — |
| 35 | 35 | — | 79 |
| 36 | 36 | 29 | 28 |
| 37 | 37 | 1 | — |
| 38 | 33 | — | 37 |
| 39 | 35 | — | 78 |
| 40 | 36 | — | 0 |

I claim:

1. A photocurable coating composition comprising a polyfunctional cellulosic polymer having an average of at least 1.5 terminal alpha,beta-ethylenic unsaturations per substituted position of anhydroglucose unit of the polymer which is derived from the reaction product of (a) from about 48 to about 69 weight percent of at least one cellulosic polymer having isocyanate reactive hydroxyl functionality, and (b) from about 52 to about 31 weight percent of at least one hydroxyl reactive poly(alpha,beta-ethylenically unsaturated) isocyanate produced from the reaction of (i) a hydroxyl functional (meth)acrylic ester with (ii) a polyisocyanate having an average of at least three hydroxyl reactive isocyanate groups wherein the molar ratio of (meth)acrylate ester to polyisocyanate ranges from about 0.6 to about 0.9.

2. The composition claimed in claim 1 wherein the cellulosic polymer in subsection (a) is selected from nitrocellulose, cellulose acetate propionate and cellulose acetate butyrate and the hydroxyl functional (meth)acrylic ester in subsection (b)(i) is hydroxyethyl methacrylate.

3. The composition claimed in claim 2 wherein the polyisocyanate in subsection (b)(ii) is a derivative of an acyclic polyvalent organic radical having at least three atoms selected from carbon, oxygen, phosphorus, nitrogen and sulfur.

4. The composition as claimed in claim 1 wherein the hydroxyl reactive poly(alpha,beta-ethylenically unsaturated) isocyanate in subsection (b) has the general formula:

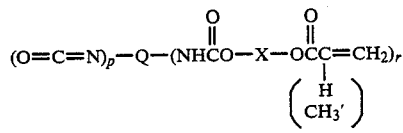

where Q is a multivalent organic radical and x is a saturated or unsaturated, linear, branched, or cyclic divalent organic radical having from 2 to 20 carbon atoms, and where p is an average of at least 1 and r is an average of at least 1.5.

5. The composition as claimed in claim 1 wherein the molar ratio of isocyanate reactive hydroxyl groups on the cellulosic polymer to hydroxyl reactive poly(unsaturated) isocyanate can ranges from about 20:1 to about 1:1.

6. The composition as claimed in claim 1 wherein said composition is capable of providing a workable intermediate dried stage which can be sanded or rubbed and a final cured stage.

7. A wood substrate having a protective coating thereon comprising a cured coating of the composition as claimed in claim 1.

8. A method for coating a substrate comprising the steps of:
(a) coating the substrate with the composition as claimed in claim 1, and
(b) drying the coating, then
(c) during said coating.

9. The method as claimed in claim 8, wherein said coating is sanded after the drying step (b), prior to the curing step (c).

10. A polyfunctional cellulosic polymer having an average of at least 1.5 terminal alpha,beta-ethylenic unsaturations per substituted position of anhydroglucose unit of the polymer, which is derived from the reaction product of (a) from about 48 to about 69 weight percent of at least one cellulosic polymer having isocyanate reactive hydroxyl functionality, and (b) from about 52 to about 31 weight percent of at least one hydroxyl reactive poly(alpha,beta-ethylenically unsaturated) isocyanate produced from the reaction of (i) a hydroxyl functional (meth)acrylic ester with (ii) a polyisocyanate having an average of at least three hydroxyl reactive isocyanate groups wherein the molar ratio of (meth)acrylic ester to polyisocyanate ranges from about 0.6 to about 0.9.

* * * * *

UNITED STATES PATENT AND TRADEMARK OFFICE
CERTIFICATE OF CORRECTION

PATENT NO. : 4,861,629

DATED : AUGUST 29, 1989

INVENTOR(S) : STEVEN H. NAHM  (CASE 3)

It is certified that error appears in the above-identified patent and that said Letters Patent is hereby corrected as shown below:

Column 4, line 13;

" 0.002 "    should read    -- 0.001 --

Column 13, line 23;

" can "    should be deleted .

Signed and Sealed this

Thirtieth Day of October, 1990

*Attest:*

HARRY F. MANBECK, JR.

*Attesting Officer*    *Commissioner of Patents and Trademarks*